(12) United States Patent
Chen et al.

(10) Patent No.: US 10,340,155 B2
(45) Date of Patent: Jul. 2, 2019

(54) SEMICONDUCTOR STRUCTURE AND METHOD OF FORMING

(71) Applicant: Taiwan Semiconductor Manufacturing Company, Ltd., Hsin-Chu (TW)

(72) Inventors: Wei-Yu Chen, Hsin-Bei (TW); Tien-Chung Yang, Hsin-Chu (TW); An-Jhih Su, Bade (TW); Hsien-Wei Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/098,843

(22) Filed: Apr. 14, 2016

(65) Prior Publication Data
US 2017/0301562 A1    Oct. 19, 2017

(51) Int. Cl.
| H01L 21/56  | (2006.01) |
| H01L 21/48  | (2006.01) |
| H01L 23/31  | (2006.01) |
| H01L 23/498 | (2006.01) |
| H01L 23/00  | (2006.01) |

(Continued)

(52) U.S. Cl.
CPC ............ *H01L 21/56* (2013.01); *H01L 21/486* (2013.01); *H01L 21/4853* (2013.01); *H01L 21/563* (2013.01); *H01L 23/13* (2013.01); *H01L 23/3178* (2013.01); *H01L 23/49811* (2013.01); *H01L 23/49822* (2013.01); *H01L 23/5389* (2013.01); *H01L 24/19* (2013.01); *H01L 24/20* (2013.01); *H01L 23/49816* (2013.01); *H01L 23/49827* (2013.01); *H01L 23/49838* (2013.01); *H01L 2224/04105* (2013.01); *H01L 2224/12105* (2013.01); *H01L 2224/16227* (2013.01); *H01L 2224/32225* (2013.01); *H01L 2224/73204* (2013.01); *H01L 2224/73267* (2013.01); *H01L 2224/92125* (2013.01); *H01L 2224/92244* (2013.01); *H01L 2924/1432* (2013.01); *H01L 2924/1436* (2013.01); *H01L 2924/1437* (2013.01); *H01L 2924/15153* (2013.01)

(58) Field of Classification Search
CPC ......... H01L 21/76883; H01L 21/76846; H01L 21/76867; H01L 21/76873; H01L 23/5226; H01L 23/53228; H01L 23/53209; H01L 23/53266
See application file for complete search history.

(56) References Cited

U.S. PATENT DOCUMENTS 8,546,957 B2 * 10/2013 Ko ..................... H01L 21/563
 257/782
9,627,308 B2 * 4/2017 Kobayashi ........ H01L 23/49822
(Continued)

*Primary Examiner* — Hoa B Trinh
(74) *Attorney, Agent, or Firm* — Slater Matsil, LLP

(57) ABSTRACT

A structure and method of forming are provided. The structure includes a dielectric layer disposed on a substrate. The structure includes a cavity in the dielectric layer, and a plurality of contacts positioned in the cavity and bonded to the substrate. A component is bonded to the plurality of contacts. Underfill is disposed in the cavity between the dielectric layer and the component. A plurality of connectors is on the dielectric layer, the connectors being connected through the dielectric layer to a conductor that is at a same level of metallization as the plurality of contacts.

19 Claims, 12 Drawing Sheets

(51) Int. Cl.
*H01L 23/13* (2006.01)
*H01L 23/538* (2006.01)

(56) References Cited

U.S. PATENT DOCUMENTS

| | | | |
|---|---|---|---|
| 2010/0000775 A1* | 1/2010 | Shen | H01L 23/3128 174/260 |
| 2013/0168856 A1* | 7/2013 | Wang | H01L 25/105 257/738 |
| 2014/0131858 A1* | 5/2014 | Pan | H01L 24/13 257/737 |
| 2014/0264811 A1* | 9/2014 | Wu | H01L 25/50 257/686 |
| 2015/0102484 A1* | 4/2015 | Chen | H01L 23/3121 257/737 |
| 2016/0172292 A1* | 6/2016 | Hsu | H01L 23/13 257/698 |

* cited by examiner

SEMICONDUCTOR STRUCTURE AND METHOD OF FORMING

BACKGROUND

With the evolving of semiconductor technologies, semiconductor chips/dies are becoming increasingly smaller. In the meantime, more functions need to be integrated into the semiconductor dies. Accordingly, the semiconductor dies need to have increasingly greater numbers of I/O pads packed into smaller areas, and the density of the I/O pads rises quickly over time. As a result, the packaging of the semiconductor dies becomes more difficult, which adversely affects the yield of the packaging.

Conventional package technologies can be divided into two categories. In the first category, dies on a wafer are packaged before they are sawed. This packaging technology has some advantageous features, such as a greater throughput and a lower cost. Further, less underfill or molding compound is needed. However, this packaging technology also suffers from drawbacks. As aforementioned, the sizes of the dies are becoming increasingly smaller, and the respective packages can only be fan-in type packages, in which the I/O pads of each die are limited to a region directly over the surface of the respective die. With the limited areas of the dies, the number of the I/O pads is limited due to the limitation of the pitch of the I/O pads. If the pitch of the pads is to be decreased, solder bridges may occur. Additionally, under the fixed ball-size requirement, solder balls must have a certain size, which in turn limits the number of solder balls that can be packed on the surface of a die.

In the other category of packaging, dies are sawed from wafers before they are packaged, and only "known-good-dies" are packaged. An advantageous feature of this packaging technology is the possibility of forming fan-out packages, which means the I/O pads on a die can be redistributed to a greater area than the die, and hence the number of I/O pads packed on the surfaces of the dies can be increased.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
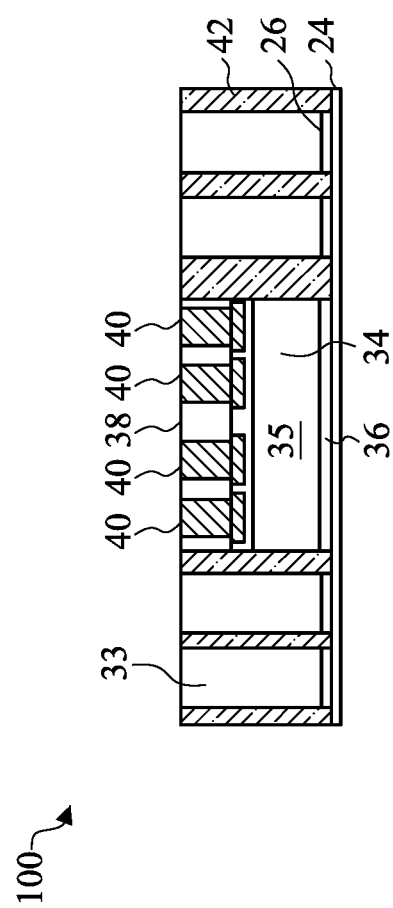
FIGS. 1, 2, 3, 4, 5, and 6A are cross-sectional views of various intermediate stages of forming a semiconductor structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor structure and methods of forming the same are provided in accordance with various exemplary embodiments. The intermediate stages of forming the semiconductor structure are illustrated and variations of embodiments are discussed. In some embodiments, a semiconductor structure may comprise a component bonded to a package. The component may be bonded to the package using a plurality of connectors. In some embodiments, an upper surface of the package may include an cavity underneath the component, and the plurality of connectors may be positioned in the cavity. In some embodiments, underfill may be disposed in the cavity and around the connectors between the component and the package. In some embodiments, the cavity may help to confine the underfill from extending beyond sidewalls of the cavity, thereby preventing or reducing the underfill from bleeding into other areas of the surface of the package and causing interference with other connectors or components. In some embodiments, the cavity may reduce the keep out zone, which is the area surrounding the component in which connectors and other components cannot be placed due to a high likelihood of contamination from underfill bleeding.

FIG. 1 depicts an example of an integrated fan out package 100 in accordance with some embodiments. Although a fan out package is discussed herein, other packages may be used. For example, in some embodiments a fan in package may be used.

Any suitable methods of forming package 100 may be used. For example, a carrier substrate (not shown) may have a buffer layer 24 formed thereon. Generally, the carrier substrate provides temporary mechanical and structural support during subsequent processing steps. The carrier substrate may include any suitable material, such as, for example, silicon based materials, such as a silicon wafer, glass or silicon oxide, or other materials, such as aluminum oxide, a ceramic material, combinations of any of these materials, or the like. In some embodiments, the carrier substrate is planar in order to accommodate further processing.

The buffer layer 24 may be a dielectric layer, which may be a polymer (such as polybenzoxazole (PBO), polyimide, benzocyclobutene (BCB), or the like), a nitride (such as silicon nitride or the like), an oxide (such as silicon oxide, PhosphoSilicate Glass (PSG), BoroSilicate Glass (BSG), Boron-doped PhosphoSilicate Glass (BPSG), or a combination thereof, or the like), or the like, and may be formed, for example, by spin coating, lamination, Chemical Vapor Deposition (CVD), or the like. In some embodiments, the buffer layer 24 is a planar layer having a uniform thickness between about 2 µm and about 6 µm. The top and the bottom surfaces of the buffer layer are planar.

Next, through vias ("TVs") 33, depicted in FIG. 1, may be formed over the buffer layer in accordance with some embodiments. The through vias 33 provide an electrical connection from one side of the package to another side of the package, as can be seen in FIG. 1. The through vias 33 may be formed, for example, by forming a conductive seed layer 26 over the buffer layer. In some embodiments, seed layer 26 is a metal layer, which may be a single layer or a composite layer comprising a plurality of sub-layers formed of different materials. The seed layer may be made of copper, titanium, nickel, gold, or a combination thereof, or the like. In some embodiments, seed layer 26 comprises a titanium layer and a copper layer over the titanium layer. Seed layer 26 may be formed using, for example, physical vapor deposition (PVD), CVD, atomic layer deposition (ALD), a combination thereof, or the like.

Next, a mask layer (not shown), such as a patterned photoresist layer, may be deposited and patterned, wherein openings in the mask layer expose seed layer 26. The openings may be filled with a conductive material using, for example, an electroless plating process or an electrochemical plating process, thereby creating TVs 33. TVs 33 may comprise copper, aluminum, tungsten, nickel, solder, or alloys thereof. The top-view shapes of TVs 33 may be rectangles, squares, circles, or the like. The heights of TVs 33 are determined by the thickness of the subsequently placed die 34, with the height of TVs 33 being greater than the thickness of die 34 in some embodiments.

Next, the mask layer may be removed, for example in an ashing and/or wet strip process. An etch step is performed to remove the exposed portions of seed layer 26, wherein the etching may be an anisotropic etching. The portions of seed layer 26 that are overlapped by TVs 33, on the other hand, remain not etched.

The TVs 33 can also be realized with metal wire studs placed by a wire bonding process, such as a copper wire bonding process.

Next, die 34 is attached to the backside of buffer layer 24 in accordance with some embodiments. In some embodiments, die 34 may be adhered to the buffer layer by an adhesive layer, such as a die-attach film (DAF). Die 34 may be a single die as illustrated in FIG. 1, or in some embodiments, two or more than two dies may be attached, and may include any die suitable for a particular approach. For example, die 34 may include a static random access memory (SRAM) chip or a dynamic random access memory (DRAM) chip, a processor, a memory chip, logic chip, analog chip, digital chip, a central processing unit (CPU), a graphics processing unit (GPU), or a combination thereof, or the like. Die 34 may be attached to a suitable location for a particular design or application. For example, FIG. 1 illustrates an embodiment in which the integrated circuit die 34 is mounted in a center region wherein TVs 33 are positioned around a perimeter. In other embodiments, die 34 may be offset from a center.

Die 34 may include a substrate 35 that is coupled to an adhesive layer 36, wherein the back surface of semiconductor substrate 35 is coupled to the adhesive layer 36. The substrate 35 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Active devices (not shown) such as transistors, capacitors, resistors, diodes, photo-diodes, fuses, and the like may be formed at the top surface of the substrate. An interconnect structure (not shown) may be formed over the substrate and electrically connect the active devices to form functional circuits. In some exemplary embodiments, the die 34 includes metal pillars 40 (such as copper posts) that are electrically coupled to devices such as transistors (not shown) in die 34 through the interconnect structure. In some embodiments, dielectric layer 38 is formed at the top surface of the respective die 34, with metal pillars 40 having at least lower portions in dielectric layer 38. The top surfaces of metal pillars 40 may also be level with the top surfaces of dielectric layer 38 in some embodiments. Alternatively, dielectric layer 38 is not formed, and metal pillars 40 protrude above a top layer of die 34.

Next, molding material 42 may be molded on die 34 and TVs 33. Molding material 42 fills the gaps between die 34 and TVs 33, and may be in contact with the buffer layer. Furthermore, molding material 42 is filled into the gaps between metal pillars 40 when metal pillars 40 are protruding metal pillars. Molding material 42 may include a molding compound, a molding underfill, an epoxy, or a resin. The top surface of molding material 42 may be higher than the top ends of metal pillars 40 and TVs 33 after the molding.

Next, a grinding step is performed to thin molding material 42, until metal pillars 40 and TVs 33 are exposed. Due to the grinding, the top ends of TVs 33 are substantially level (coplanar) with the top ends of metal pillars 40, and are substantially level (coplanar) with the top surface of molding material 42. As a result of the grinding, metal residues such as metal particles may be generated, and left on the top surfaces. Accordingly, after the grinding, a cleaning may be performed, for example, through a wet etching, so that the metal residue is removed.

Figure 2:
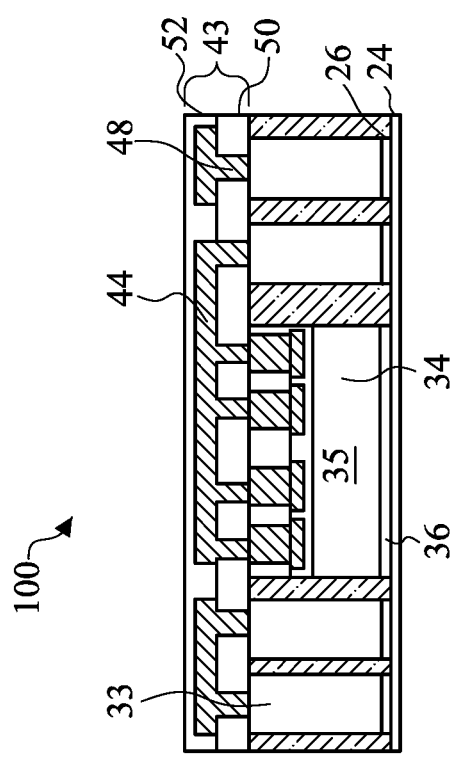

Next, referring to FIG. 2, one or more redistribution layers (RDLs) 43 are formed. Generally, RDLs provide a conductive pattern that allows a pin-out contact pattern for a completed package different than the pattern of TVs 33 and/or metal pillars 40, allowing for greater flexibility in the placement of TVs 33 and die 34. The RDLs may be utilized to provide an external electrical connection to die 34 and/or to TVs 33. The RDLs may further be used to electrically couple die 34 to TVs 33, which may be electrically coupled to one or more other packages, package substrates, components, the like, or a combination thereof. The RDLs comprise conductive lines 44 and via connections 48, wherein via connections 48 connect an overlying line (e.g., an overlying conductive line 44) to an underlying conductive feature (e.g., TVs 33, metal pillars 40, and/or conductive line 44).

The RDLs 43 may be formed using any suitable process. For example, in some embodiments, dielectric layer 50 is formed on the molding material 42 and die 34. In some embodiments, dielectric layer 50 is formed of a polymer, which may be a photo-sensitive material such as polybenzoxazole (PBO), polyimide, benzocyclobutene (BCB), or the like, that may be patterned using lithography. In other embodiments, dielectric layer 50 is formed of a nitride such as silicon nitride, an oxide such as silicon oxide, Phospho-Silicate Glass (PSG), BoroSilicate Glass (BSG), Boron-doped PhosphoSilicate Glass (BPSG), or the like. Dielectric layer 50 may be formed by spin coating, lamination, CVD, the like, or a combination thereof. Dielectric layer 50 is then patterned to form openings to expose metal pillars 40 and TVs 33. In embodiments in which dielectric layer 50 is formed of a photo-sensitive material, the patterning may be performed by exposing dielectric layer 50 in accordance with a desired pattern and developed to remove the unwanted material, thereby exposing metal pillars 40 and TVs 33. Other methods, such as using a patterned mask and etching, may also be used to pattern dielectric layer 50.

A seed layer (not shown) is formed over dielectric layer 50 and in the openings formed in dielectric layer 50. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD, or the like. A mask is then formed and patterned on the seed layer in accordance with a desired redistribution pattern, such as the pattern illustrated in FIG. 1. In some embodiments, the mask is a photoresist formed by spin coating or the like and exposed to light for patterning. The patterning forms openings through the mask to expose the seed layer. A conductive material is formed in the openings of the mask and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed, are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the conductive lines 44 and via connections 48. Dielectric layer 52 is formed over dielectric layer 50 to provide a more planar surface for subsequent layers and may be formed using similar materials and processes as used to form dielectric layer 50. In some embodiments, dielectric layer 52 is formed of polymer, a nitride, an oxide, or the like. In some embodiments, dielectric layer 52 is PBO formed by a spin-on process.

In some embodiments, additional RDLs 43 may be formed. The additional RDLs may be formed using similar processes and materials as described above with reference to other RDLs.

Figure 3:
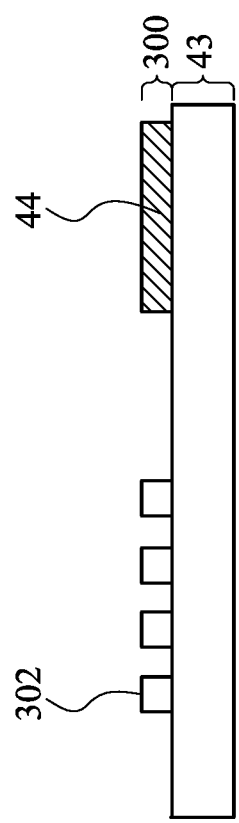

Next, referring to FIG. 3, an uppermost layer of metallization 300 is formed above the RDLs 43. For simplicity, details of the package are omitted and only a portion of RDL 43, the portion to which a component will be bonded, is shown in FIGS. 3-5, 6A, 7, 8A, and in the cross sectional views of FIGS. 9 and 10. However, the discussion above regarding package 100 applies to each of the embodiments depicted in each of the Figures.

Uppermost metallization layer 300 may be formed using the same or similar processes as those described above in connection with RDLs 43. Uppermost metallization layer 300 may include contacts 302 and conductive line 44. Contacts 302 may be used for external connection to a component, whereas conductive lines 44 in uppermost metallization layer 300 are not directly used for external connections in some embodiments.

Figure 4:
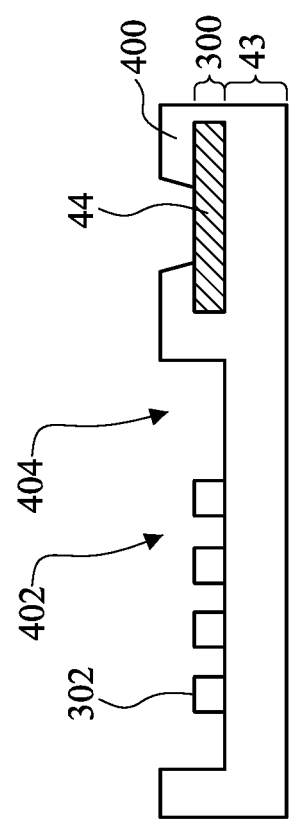

Next, referring to FIG. 4, a dielectric layer 400 is deposited over uppermost layer of metallization 300 and patterned. Dielectric layer 400 may be formed using processes that are the same as or similar to those described above. Dielectric layer 400 is patterned, for example using photolithogaphy, to expose a portion of conductive line 44. Dielectric layer 400 is also patterned, for example using photolithography, to expose contacts 302 and create a cavity 402 surrounding contacts 302. As will be discussed in greater detail below, a component will be bonded to contacts 302 and underfill will be disposed around contacts 302 between the component and the underlying RDLs 43. Cavity 402 may confine or help to confine the underfill to the desired area and prevent or reduce underfill from bleeding into other areas of the surface of the package and causing undesirable interference.

As can be seen from FIG. 4, cavity 402 is created surrounding contacts 302 so that there is a larger open area on one side of cavity 402 than on other sides of cavity 402. The larger open area of cavity 402 forms an underfill dispensing region 404. As will be explained in further detail below, the underfill will be deposited in the underfill dispensing region 404 of the cavity and will flow into the spaces surrounding the contacts 302, for example due to capillary force. The open area of underfill dispensing region 404 provides processing space for the underfill process.

Figure 5:
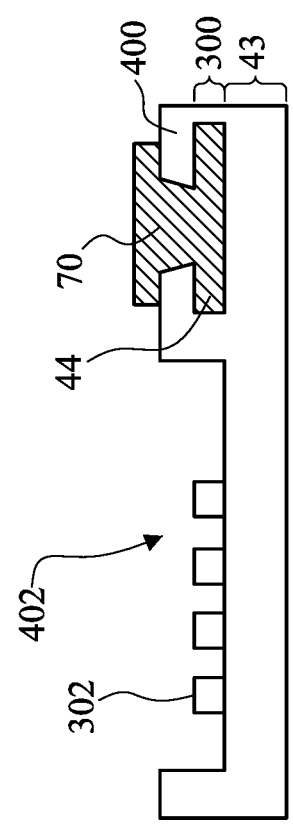

Next, an under bump metallization (UBM) 70 is formed and patterned over conductive line 44 of uppermost metallization layer 300 in accordance with some embodiments, thereby forming an electrical connection with conductive line 44 in the embodiment illustrated in FIG. 5. The UBM 70 provides an electrical connection upon which an electrical connector, e.g., a solder ball/bump, a conductive pillar, or the like, may be placed. In an embodiment, the under bump metallization 70 includes a diffusion barrier layer, a seed layer, or a combination thereof. The diffusion barrier layer may include Ti, TiN, Ta, TaN, or combinations thereof. The seed layer may include copper or copper alloys. However, other metals, such as nickel, palladium, silver, gold, aluminum, combinations thereof, and multi-layers thereof, may also be included. In an embodiment, under bump metallization 70 is formed using sputtering. In other embodiments, electro plating may be used.

Figure 6A:
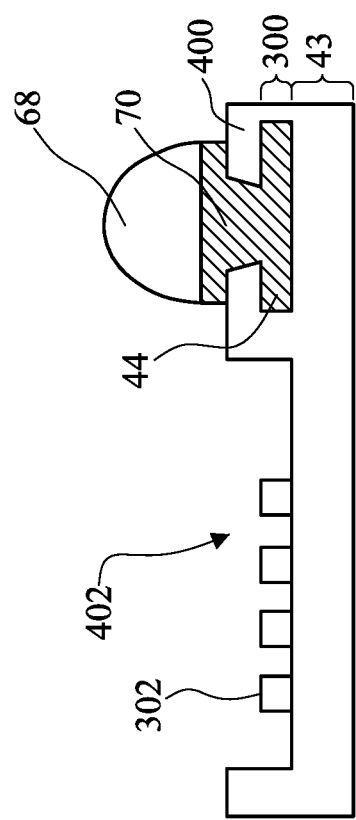

Referring to FIG. 6A, a connector 68 is formed over the under bump metallization 70 in accordance with some embodiments. Connector 68 may be a solder ball, metal pillar, controlled collapse chip connection (C4) bump, micro bump, electroless nickel-electroless palladium-immersion gold technique (ENEPIG) formed bump, a combination thereof (e.g., a metal pillar having a solder ball attached thereto), or the like. Connector 68 may include a conductive material such as solder, copper, aluminum, gold, nickel, silver, palladium, tin, the like, or a combination thereof. In some embodiments, connectors 68 comprises a eutectic material and may comprise a solder bump or a solder ball, as examples. The solder material may be, for example, lead-based and lead-free solders, such as Pb—Sn compositions for lead-based solder; lead-free solders including InSb; tin, silver, and copper (SAC) compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free connectors such as solder balls may be formed from SnCu compounds as well, without the use of silver (Ag). Alternatively, lead-free solder connectors may include tin and silver, Sn—Ag, without the use of copper. In some embodiments, a reflow process may be performed, giving the connector 68 a shape of a partial sphere in some embodiments. Alternatively, connector 68 may comprise other shapes. The connector 68 may also comprise a non-spherical conductive connector, for example.

In some embodiments, the connector 68 comprises a metal pillar (such as a copper pillar) formed by a sputtering, printing, electro plating, electroless plating, CVD, or the like, with or without a solder material thereon. The metal pillar may be solder free and have substantially vertical sidewalls or tapered sidewalls.

Figure 6B:
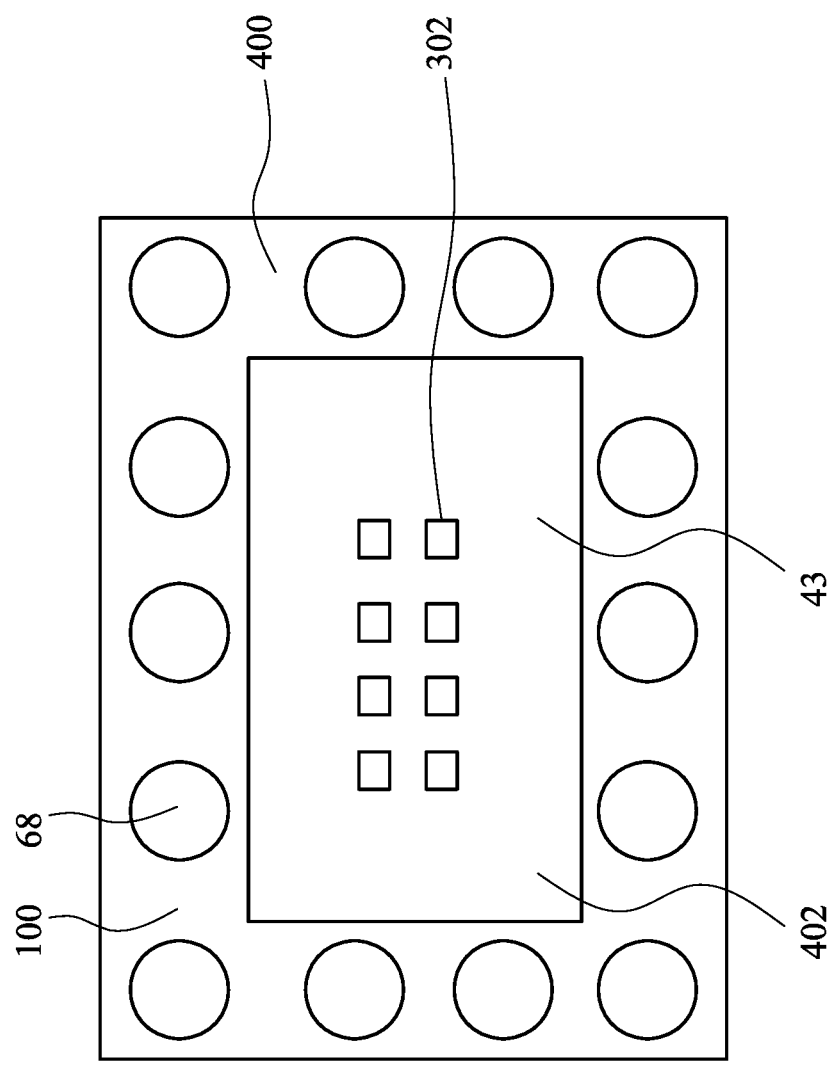
FIG. 6B is a plan view of an intermediate stage of forming a semiconductor structure in accordance with some embodiments.

Although only one connector 68 is shown in FIG. 6A, in some embodiments a plurality of connectors 68 is formed surrounding the cavity 402. This is illustrated in FIG. 6B. In some embodiments, connectors 68 may be distributed substantially evenly along the perimeter of the cavity 402. In some embodiments, connectors may be spaced along an edge of a keep out zone, which is an area in which connectors 68 are not placed due to interference caused by an underfill being applied to an area of the package and bleeding out of the desired area into surrounding areas of the package surface.

Figure 7:
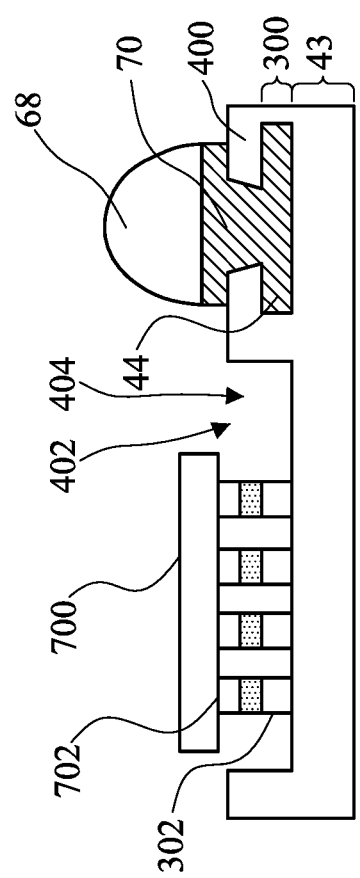
FIGS. 7 and 8A are cross-sectional views of various intermediate stages of forming a semiconductor structure in accordance with some embodiments.

Next, referring to FIG. 7, component 700 is bonded to contacts 302. In some embodiments, component 700 may be an integrated passive device. In some embodiments, component 700 may be an active device. Component 700 may be a die in some embodiments. Any component that is suitable for a particular application may be used. In some embodiments, component 700 may be a multi-terminal component. For example, in some embodiments component 700 may have more than two terminals. In some embodiments, component 700 may have two terminals or less.

As shown in FIG. 7, component 700 may be bonded to package 100 through contacts 302. Component 700 may include one or more connectors 702 on a surface of component 700. Component 700 may be bonded to package 100 by bonding contacts 302 to connectors 702. In some embodiments, more than two connectors 702 are respectively bonded to a same number of contacts 302.

Figure 8A:
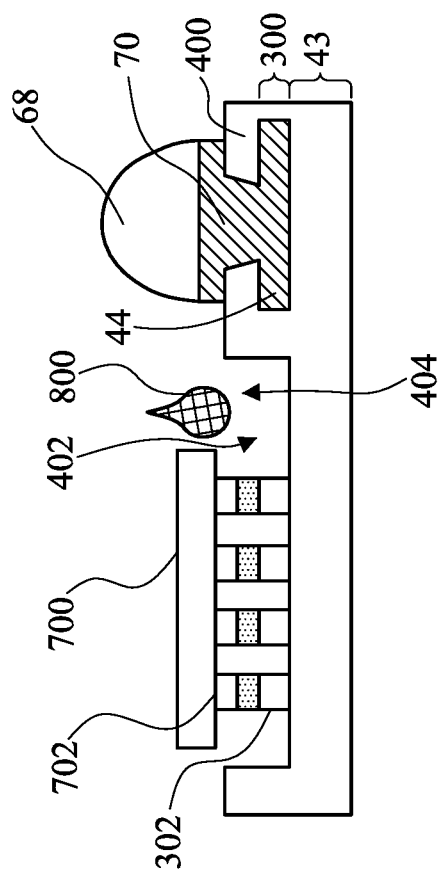

Referring to FIG. 8A, underfill 800 is added to cavity 402. In some embodiments the underfill 800 is a protective material used to cushion and support component 700 from operational and environmental degradation, such as stresses caused by the generation of heat during operation. Underfill 800 may comprise, for example, a liquid epoxy or other protective material, and then cured to harden.

In some embodiments, underfill 800 may be placed between component 700 and RDLs 43 by dispensing the underfill 800 into the underfill dispensing region 404 of cavity 402. The underfill 800 may be injected into the underfill dispensing region 404 in liquid form such that it flows into the spaces underneath component 700 and around contacts 302 using capillary force. Cavity 402 will help to confine the underfill 800 into the cavity 402, and may reduce or prevent underfill 800 from creeping out of the desired area and causing unwanted interference with connector 68.

Figure 8B:
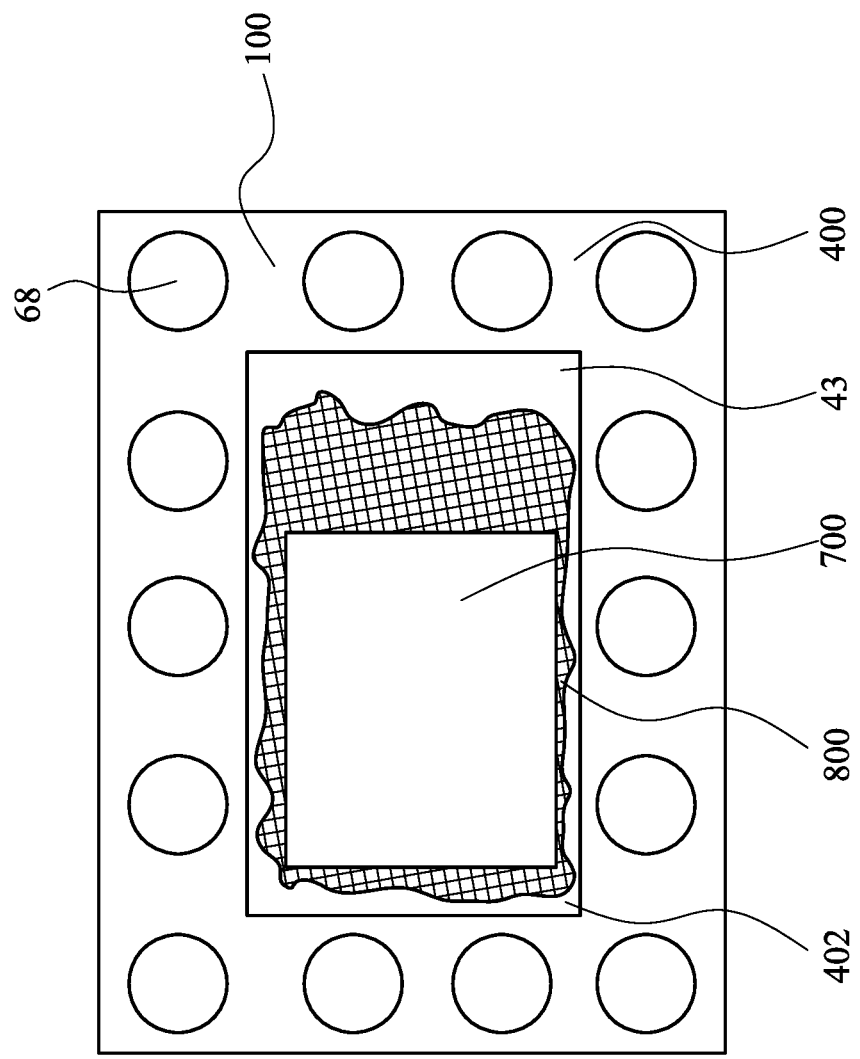
FIG. 8B is a plan view of a semiconductor structure in accordance with some embodiments.

Referring to FIG. 8B, a plan view of a semiconductor structure is shown in accordance with some embodiments. A component 700 is bonded to package 100 over a cavity 402. Underfill 800 has been disposed into the cavity 402 in a manner that the underfill has filled gaps between contacts 302 (shown in FIG. 8A) and between component 700 and an uppermost RDL 43, which forms the bottom surface of cavity 402. As illustrated by FIG. 8B, portions of underfill 800 may or may not extend to dielectric layer 400, such as to a sidewall of cavity 402. Furthermore, although underfill 800 is illustrated as only partially filling cavity 402 in a top-down view, in other embodiments, underfill 800 may completely fill cavity 402 in a top-down view. A center point of component 700 may be offset from a center point of underfill 800 such that underfill 800 extends further from a first side of component 700 than a second side of component 700. The underfill 800 is confined to cavity 402 in some embodiments. A plurality of connectors 68 are positioned along a perimeter of cavity 402.

Finally, the processing of package 100 may conclude with the carrier substrate (not shown) being de-bonded from the package 100 and the buffer layer (not shown) being cleaned from the package 100. If a plurality of packages 100 have been formed on a wafer, the wafer may be singulated into a plurality of packages 100.

Figure 9:
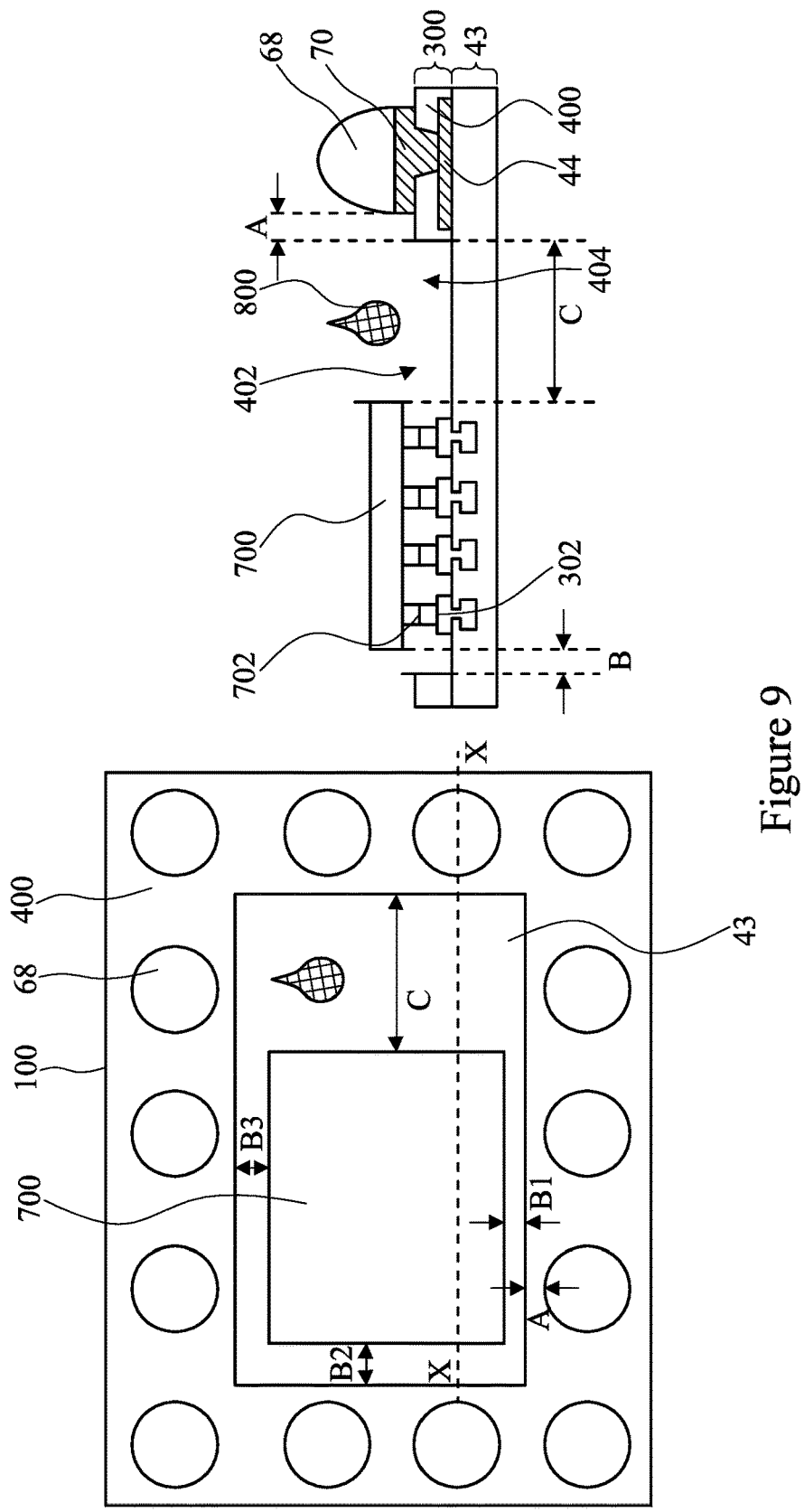
FIG. 9 is a cross-sectional view and a plan view of an intermediate stage of forming a semiconductor structure in accordance with some embodiments.

Referring to FIG. 9, a plan view and a cross sectional view of a semiconductor structure is shown in accordance with some embodiments. The cross sectional view is taken along the line X-X as depicted in the plan view.

The structure includes a component 700 that is bonded to a surface of package 100. Package 100 includes an upper metallization layer 300 over RDLs 43. Component 700 is bonded to package 100 using contacts 302, which are included in upper metallization layer 300. A plurality of connectors 68 are disposed on package 100. Each connector 68 is electrically and physically connected to upper metallization layer 300 by UBM 70. UBM extends through dielectric layer 400 on the upper surface of package 100 to contact upper metallization layer 300.

Component 700 is positioned over cavity 402. Cavity 402 is an opening in dielectric layer 400 on the upper surface of package 100. The perimeter of cavity 402 extends around a perimeter of component 700. As discussed above, cavity 402 includes an underfill dispensing region 404. The underfill 800 may be injected into the underfill dispensing region 404 in liquid form such that it flows into the spaces underneath component 700 and around contacts 302 using capillary force. Cavity 402 may help to confine the underfill 800 into the cavity 402, and may reduce or prevent underfill 800 from creeping out of the desired area and causing unwanted interference with connectors 68.

A side of component 700 that is proximate to the underfill dispensing region 404 may be referred to as a "flow-in side," because underfill 800 that is dispensed into the underfill dispending region 404 will "flow in" to the area underneath the component 700 from that side. Other sides of component 700 may be referred to as a "flow-out side," because underfill 800 may flow out of that side from beneath the component 700 and into the perimeter areas of the cavity 402. These names are for ease of reference, and are not intended to be limiting.

In some embodiments, the edges of the flow-out sides of component 700 are respectively positioned a minimum distance B away from a closest edge of dielectric layer 400. In some embodiments, as depicted in FIG. 9, component 700 may include three flow-out sides. The first flow-out side is positioned a minimum distance B1 away from a closest edge of dielectric layer 400, the second flow-out side is positioned a minimum distance B2 away from a closest edge of dielectric layer 400, and the third flow-out side is positioned a minimum distance B3 away from a closest edge of dielectric layer 400. In some embodiments, distance B1, distance B2, and distance B3 are about an equal distance. In some embodiments, minimum distance B1, minimum distance B2, and minimum distance B3 may be different distances. In some embodiments, minimum distance B (including minimum distance B1, minimum distance B2 and minimum distance B3) may be about 0 μm to about 100 μm, such as 50 μm.

An edge of component 700 on a flow-in side may be positioned a minimum distance C from the closest edge of dielectric layer 400. In some embodiments, minimum distance C may be greater than distance B. For example, additional room may be advantageous for certain process steps, such as dispensing the underfill 800 into the underfill dispensing region 404. In some embodiments, minimum distance C may be about 100 μm to about 200 μm, such as 150 μm.

In some embodiments, connectors 68 are positioned a minimum distance A away from an edge of dielectric layer 400 that forms cavity 402. For example, minimum distance A may be a minimum distance that defines the edges of a keep out zone, which is a zone in which connectors are generally not placed in order to eliminate or reduce a probability that underfill 800 will bleed out of cavity 402 an interfere with a connector 68. In some embodiments, distance A may be about 0 μm to about 150 μm, such as 75 μm.

Figure 10:
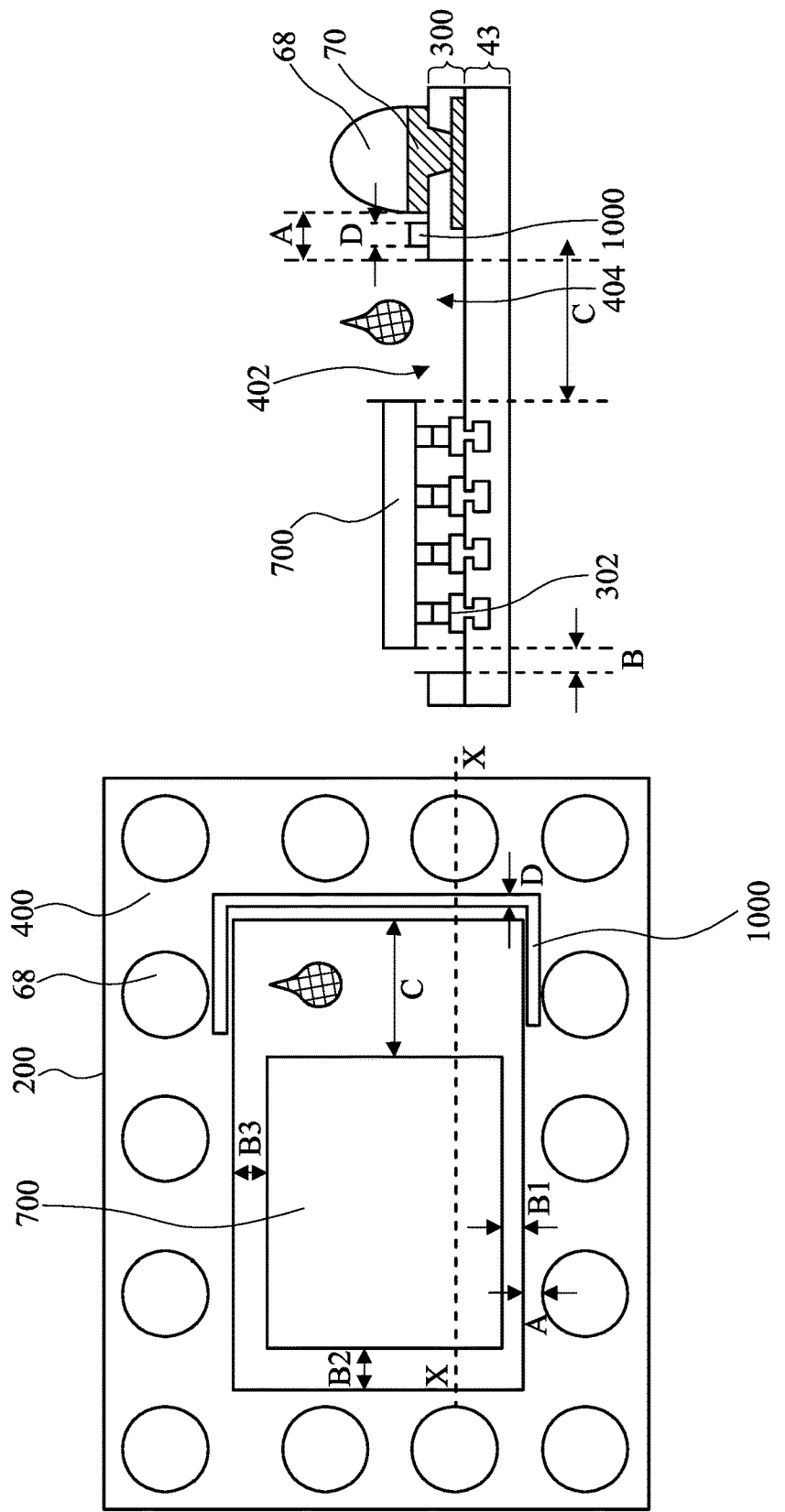
FIG. 10 is a cross-sectional view and a plan view of an intermediate stage of forming a semiconductor structure in accordance with some embodiments.

Other embodiments are possible. Referring to FIG. 10, a plan view and a cross sectional view of a semiconductor structure is shown in accordance with some embodiments. The structure includes a component 700 that is bonded to a surface of package 200. Package 200 includes an upper metallization layer 300 over RDLs 43. Component 700 is bonded to package 200 using contacts 302, which are included in upper metallization layer 300. A plurality of connectors 68 are disposed on package 100. Each connector 68 is electrically and physically connected to upper metallization layer 300 by UBM 70. UBM extends through dielectric layer 400 on the upper surface of package 200 to connect to upper metallization layer 300.

Component 700 is positioned over cavity 402. Cavity 402 is an opening in dielectric layer 400 on the upper surface of package 200. The perimeter of cavity 402 extends around a perimeter of component 700. Cavity 402 includes an underfill dispensing region 404. The underfill 800 may be injected into the underfill dispensing region 404 in liquid form such that it flows into the spaces underneath component 700 and around contacts 302 using capillary force. Cavity 402 may help to confine the underfill 800 to the cavity 402, and may reduce or prevent underfill 800 from creeping out of the desired area and causing unwanted interference with connectors 68.

In some embodiments, the edges of the flow-out sides of component 700 are respectively positioned a minimum distance B away from a closest edge of dielectric layer 400. In some embodiments, as depicted in FIG. 10, component 700 may include three flow-out sides. The first flow-out side is positioned a minimum distance B1 away from a closest edge of dielectric layer 400, the second flow-out side is positioned a minimum distance B2 away from a closest edge of dielectric layer 400, and the third flow-out side is positioned a minimum distance B3 away from a closest edge of dielectric layer 400. In some embodiments, minimum distance B1, minimum distance B2, and minimum distance B3 are about an equal distance. In some embodiments, minimum distance B1, minimum distance B2, and minimum distance B3 may be different distances. In some embodiments, minimum distance B (including minimum distance B1, minimum distance B2 and minimum distance B3) may be about 0 μm to about 100 μm, such as 50 μm.

An edge of component 700 on a flow-in side may be positioned a minimum distance C from the closest edge of dielectric layer 400. In some embodiments, d minimum distance C may be greater than distance B. For example, additional room may be advantageous for certain process steps, such as dispensing the underfill 800 into the underfill dispensing region 404. In some embodiments, minimum distance C may be about 100 μm to about 200 μm, such as 150 μm.

In some embodiments, connectors 68 are positioned a minimum distance A away from an edge of dielectric layer 400 that forms cavity 402. For example, minimum distance A may be a minimum distance that defines the edges of a keep out zone, which is a zone in which connectors are generally not placed in order to eliminate or reduce a probability that underfill 800 will bleed out of cavity 402 an interfere with a connector 68. In some embodiments, minimum distance A may be about 0 μm to about 150 μm, such as 75 μm.

In some embodiments, a dam 1000 may be positioned on dielectric layer 400. Dam 1000 may be positioned in a manner than dam 1000 is proximate to cavity 402 and may act as a barrier between cavity 402 and one or more connectors 68. In some embodiments dam 1000 extends along dielectric layer 400 in a manner that follows a portion of the perimeter of cavity 402. For example, dam 1000 may extend along a portion of the perimeter of cavity 402 that is proximate to the underfill dispensing region 404, as depicted in FIG. 10, although dam 1000 may be positioned in any suitable location. Dam 1000 may have a U shape that comprises three branches that each extend along different edges of cavity 402. As depicted in FIG. 10, dam 1000 may have a middle branch that extends fully along one sidewall of cavity 402, and two secondary branches that contact the middle branch and respectively extend partially along an other sidewall of cavity 402. The U shape may extend along three sides of underfill dispensing region 404. In some embodiments, dam 1000 may have a thickness D that is about 5 μm to about 15 μm, such as 10 μm. In some embodiments, distance A is greater than twice the size of thickness D.

As described above, a component may be bonded to a package over a cavity. In some embodiments, the cavity may help to confine the underfill from extending beyond sidewalls of the cavity, thereby preventing or reducing the underfill from bleeding into other areas of the surface of the package and interfering with other connections on the surface of the package. In some embodiments, the cavity may reduce the area surrounding the component in which connectors and other components cannot be placed due to high likelihood of contamination from underfill bleeding.

A structure is provided in accordance with some embodiments. The structure includes a dielectric layer disposed on a substrate. A cavity is in the dielectric layer, and a plurality of contacts positioned in the cavity and bonded to the substrate. The structure includes a component bonded to the plurality of contacts. Underfill is disposed in the cavity between the dielectric layer and the component. A plurality of connectors are included on the dielectric layer, the connectors being connected through the dielectric layer to a conductor that is at a same level of metallization as the plurality of contacts.

A method is provided in accordance with some embodiments. The method includes patterning a dielectric layer to create a cavity in a dielectric layer. A plurality of contacts is exposed in the cavity. The method also includes bonding a component to the plurality of contacts, a perimeter of the cavity extending around a perimeter of the component. The method also includes placing underfill in the cavity in a manner that causes the underfill to fill spaces between the component and the dielectric layer around the plurality of contacts. The method also includes forming a connector over the dielectric layer beside the cavity, where the connector extends through the dielectric layer to contact an underlying conductor that is at a same level of metallization as the plurality of contacts.

A method is provided in accordance with some embodiments. The method includes forming a plurality of contacts and a plurality of conductive lines on a substrate and depositing a dielectric layer over the plurality of contacts and the plurality of conductive lines. The method also includes patterning the dielectric layer to form a first cavity, the plurality of contacts exposed through the first cavity. The method also includes patterning the dielectric layer to form a plurality of second cavities, where a conductive line is exposed through each of the plurality of second cavities. The method also includes forming a connector in each of the plurality of second cavities, each connector being connected to the respective conductive line exposed in each of the second cavities. The method also includes bonding a device to the plurality of contacts, the device positioned over the first cavity in a manner that a bottom surface of the device is beyond an upper edge of a sidewall of the first cavity. The method also includes and placing underfill in the first cavity, the underfill extending along sidewalls of the plurality of contacts and sidewalls of the first cavity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a dielectric layer;
   after forming the dielectric layer, patterning the dielectric layer to create a cavity in the dielectric layer, a plurality of contacts being exposed in the cavity, wherein all contacts of the plurality of contacts are disposed on and physically connected to a single redistribution layer overlying a substrate;
   after patterning the dielectric layer, bonding a component to the plurality of contacts, a perimeter of the cavity extending around a perimeter of the component
   after bonding the component to the plurality of contacts, placing underfill in the cavity in a manner that causes the underfill to fill spaces under the component and around the plurality of contacts, wherein the underfill is placed in liquid form in a first area of the cavity, and the underfill flows from the first area into the spaces under the component and around the plurality of contacts, and wherein after the underfill fills the spaces under the component and around the plurality of contacts, a first section of the underfill extends a first distance away from a first sidewall of the component towards a first sidewall of the dielectric layer, a second section of the underfill extends a second distance away from a second sidewall of the component towards a second sidewall of the dielectric layer, and the first distance is greater than the second distance; and
   forming a connector over the dielectric layer beside the cavity, wherein the connector extends through the dielectric layer to contact an underlying conductor that is at a same level of metallization as the plurality of contacts and attaches to the single redistribution layer.

2. The method of claim 1, wherein after the underfill fills the spaces under the component and around the plurality of contacts, the underfill does not extend along a top surface of the dielectric layer.

3. The method of claim 1, further comprising: forming a dam on the dielectric layer between an edge of the cavity and the connector.

4. The method of claim 1, wherein the component does not overlie the first area.

5. A method, comprising:
   forming a plurality of contacts and a plurality of conductive lines on a single redistribution layer overlying a substrate, wherein all contacts of the plurality of contacts are physically connected to the single redistribution layer;
   depositing a dielectric layer over the plurality of contacts and the plurality of conductive lines;
   patterning the dielectric layer to form a first cavity, the plurality of contacts exposed through the first cavity;
   patterning the dielectric layer to form a plurality of second cavities, wherein a conductive line is exposed through each of the plurality of second cavities;
   forming a connector in each of the plurality of second cavities, each connector connected to the respective conductive line exposed in each of the second cavities;
   bonding a device to the plurality of contacts, the device being positioned over the first cavity in a manner that a bottom surface of the device is higher than a top surface of the dielectric layer; and
   placing underfill in the first cavity, wherein the underfill is placed in liquid form in a first area of the first cavity, and the underfill flows from the first area into spaces between the device and the dielectric layer, and after the underfill flows into the spaces between the device and the dielectric layer the underfill extends along sidewalls of the plurality of contacts and sidewalls of the first cavity.

6. The method of claim 5, further comprising:
   forming a dam over the dielectric layer, the dam positioned between one of the connectors and a sidewall of the first cavity.

7. The method of claim 6, wherein the dam extends along the dielectric layer in a manner that follows at least a portion of a perimeter of the first cavity.

8. The method of claim 5, wherein a centerpoint of the device is offset from a centerpoint of the first cavity.

9. A method, comprising:
   patterning a dielectric layer to create a first cavity in a dielectric layer and a second cavity in the dielectric layer, a plurality of contacts being exposed in the first cavity and a conductive line being exposed in the second cavity, wherein the conductive line and all contacts of the plurality of contacts are disposed on and physically connected to a single redistribution layer overlying a substrate;

bonding a component to the plurality of contacts;

forming an underbump metallization in the second cavity; and injecting an underfill into a first region of the first cavity, wherein the underfill flows from the first region to a second region, wherein the first region is between a sidewall of the component and a sidewall of the first cavity that is closest to the underbump metallization, and wherein the second region extends between the component and the single redistribution layer.

10. The method according to claim 9, further comprising: positioning a dam over the dielectric layer.

11. The method according to claim 10, wherein the dam extends along three sides of the first cavity.

12. The method according to claim 9, further comprising forming a connector over the underbump metallization.

13. The method according to claim 12, wherein a surface of the connector that is farthest from the underbump metallization is higher than a surface of the component that is farthest from the plurality of contacts.

14. The method according to claim 9, wherein the plurality of contacts and the conductive line are formed in a same metallization layer.

15. The method according to claim 9, wherein a perimeter of the component is within a perimeter of the first cavity in a plan view.

16. The method according to claim 9, wherein a distance from a first sidewall of the component to a first sidewall of the first cavity that faces the first sidewall of the component is a first distance, wherein a distance from a second sidewall of the component to a second sidewall of the first cavity that faces the component is a second distance, and wherein the first distance and the second distance are the same.

17. The method according to claim 9, wherein a distance from a first sidewall of the component to a first sidewall of the first cavity that faces the first sidewall of the component is a first distance, wherein a distance from a second sidewall of the component to a second sidewall of the first cavity that faces the component is a second distance, and wherein the first distance and the second distance are different.

18. The method according to claim 3, wherein the dielectric layer is formed over the substrate, and the dam is farther from the substrate than a surface of the dielectric layer that is farthest from the substrate.

19. The method according to claim 18, wherein a major axis of a first portion of the dam is parallel to the edge of the cavity, and a major axis of a second portion of the dam is perpendicular to the major axis of the first portion of the dam.

* * * * *